United States Patent

Freeman et al.

[11] Patent Number: 6,121,838
[45] Date of Patent: Sep. 19, 2000

[54] PRECISION GAAS LOW-VOLTAGE DC AMPLIFIER

[75] Inventors: William R. Freeman, Castro Valley; Philip D. Shapiro, Palo Alto, both of Calif.

[73] Assignee: Finisar Corporation, Mountain View, Calif.

[21] Appl. No.: 09/221,673

[22] Filed: Dec. 23, 1998

[51] Int. Cl.[7] .................................................. H03F 3/45
[52] U.S. Cl. .......................... 330/253; 330/256; 330/261; 330/289; 330/133; 330/134; 330/285
[58] Field of Search .................................... 330/253, 256, 330/261, 289, 133, 134, 285

[56] References Cited

U.S. PATENT DOCUMENTS

| | | | |
|---|---|---|---|
| 4,101,841 | 7/1978 | Okada et al. | 330/289 |
| 4,868,902 | 9/1989 | Sato | 330/253 |
| 4,897,613 | 1/1990 | Rao et al. | 330/253 |
| 5,159,288 | 10/1992 | Ito | 330/256 |

*Primary Examiner*—Michael B Shingleton
*Attorney, Agent, or Firm*—Pennie & Edmonds LLP

[57] ABSTRACT

A precision GaAs low-voltage DC amplifier includes a level shift circuit, an amplifier and a first and a second bias control circuit. The level shift circuit shifts an input signal to generate a level shifted input signal, whose bias level is controlled by a first bias control voltage. The amplifier amplifies the level shifted input signal to generate an output signal. The bias level of the output signal is controlled by a second bias control voltage. The first bias control circuit insures that the first bias control voltage varies as necessary with temperature to hold constant the bias level of the level shifted input signal. The second bias control circuit insures that the second bias control voltage varies as necessary with temperature to hold constant the bias level of the output signal.

20 Claims, 8 Drawing Sheets

6,121,838

PRECISION GAAS LOW-VOLTAGE DC AMPLIFIER

FIELD OF THE INVENTION

The present invention relates to an amplifier. In particular, the present invention relates a precision, low-voltage, DC coupled GaAs amplifier.

BACKGROUND OF THE INVENTION

Fiber optic receivers typically deal with very low signal levels. For example, a typical receiver preamp input signal level is on the order of 2–10 µA, while a typical receiver postamp input signal level is on the order of 10–15 mV. These low voltage levels are generally amplified prior to their processing by digital circuitry, which usually requires signal levels of at least 0.4–1 V.

GaAs circuitry can operate over a very large frequency range, from DC to a few gigahertz. However, designing D.C. coupling in GaAs is difficult because of the great variability of operational characteristics with process and temperature. For example, the $V_{GS}$ of a GaAs transistor may vary as much as 400 mV over process and temperature for a given current. Thus, GaAs appears to be an impractical process for precisely level-shifting and amplifying signals from fiber optic transceivers using low voltage power supplies.

SUMMARY OF THE INVENTION

The precision GaAs low-voltage DC amplifier of the present invention is suitable for amplifying and level shifting signals output from a fiber optic system prior to digital processing. The GaAs amplifier of the present invention includes a level shift circuit, an amplifier and two bias control circuits. The level shift circuit shifts an input signal to generate a level shifted input signal, whose bias level is controlled by a first bias control voltage. The amplifier amplifies the level shifted input signal to generate an output signal, whose bias level is controlled by a second bias control voltage. A first bias control circuit insures that the first bias control voltage varies as necessary with temperature and process to hold constant the bias level of the level shifted input signal. The first bias control circuit includes a first operational amplifier and a first model circuit, which models the behavior of the level shift circuit. A second bias control circuit insures that the second bias control varies as necessary with temperature and process to hold constant the bias level of the output signal. The second bias control circuit includes a second operational amplifier and a second model circuit, which models the behavior of the amplifier.

Several amplifiers of the present invention may be DC coupled together to precisely amplify a low level input signal of approximately 10–15 mV up to a level compatible with digital circuitry using a 3 volt power supply. Other objects, features, and advantages of the present invention will be apparent from the accompanying drawings and detailed description that follows.

BRIEF DESCRIPTION OF THE DRAWINGS

The present invention is illustrated by way of example and not by way of limitation in the figures of the accompanying drawings. In the accompanying drawings similar references indicate similar elements.

DETAILED DESCRIPTION OF THE PREFERRED EMBODIMENTS

Figure 1:
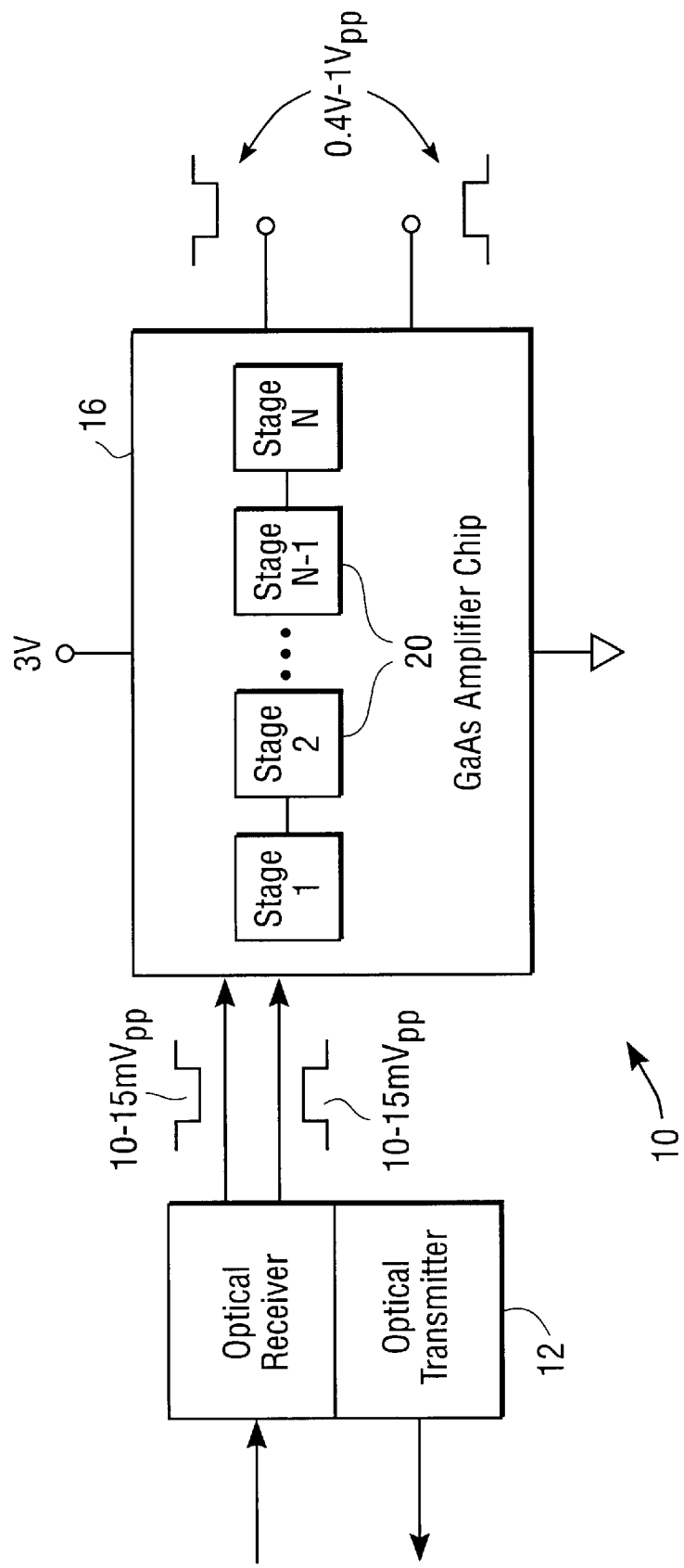
FIG. 1 is a block diagram a system incorporating the amplifier of the present invention.

FIG. 1 illustrates in block diagram form fiber optic system 10, in which the amplifier stage 20 of the present invention is intended to operate. Using several amplifier stages 20, interface chip 16 takes the low peak-to-peak input voltage received from a fiber optic transceiver 12 and generates an output voltage whose peak-to-peak voltage is sufficient to operate low-voltage digital circuitry. Implementing interface chip 16 in GaAs offers the ability to handle input voltages whose frequencies range from DC to a few gigahertz. Despite the large process and temperature variations of GaAs devices, amplifier stages 20 are able to precisely level shift and amplify signals using a level shift circuit and two bias control circuits. Each bias control circuit insures that a critical bias level remains constant despite temperature and process induced changes in the operational characteristics of GaAs devices within stage 20. The bias control circuits will be described in detail with respect to FIGS. 3–6. In one embodiment of the bias control circuits, a precision temperature-compensated operational amplifier is used, which will be described in greater detail with respect to FIGS. 7 and 8.

A. Overview of the Amplifier Stage

Figure 2:
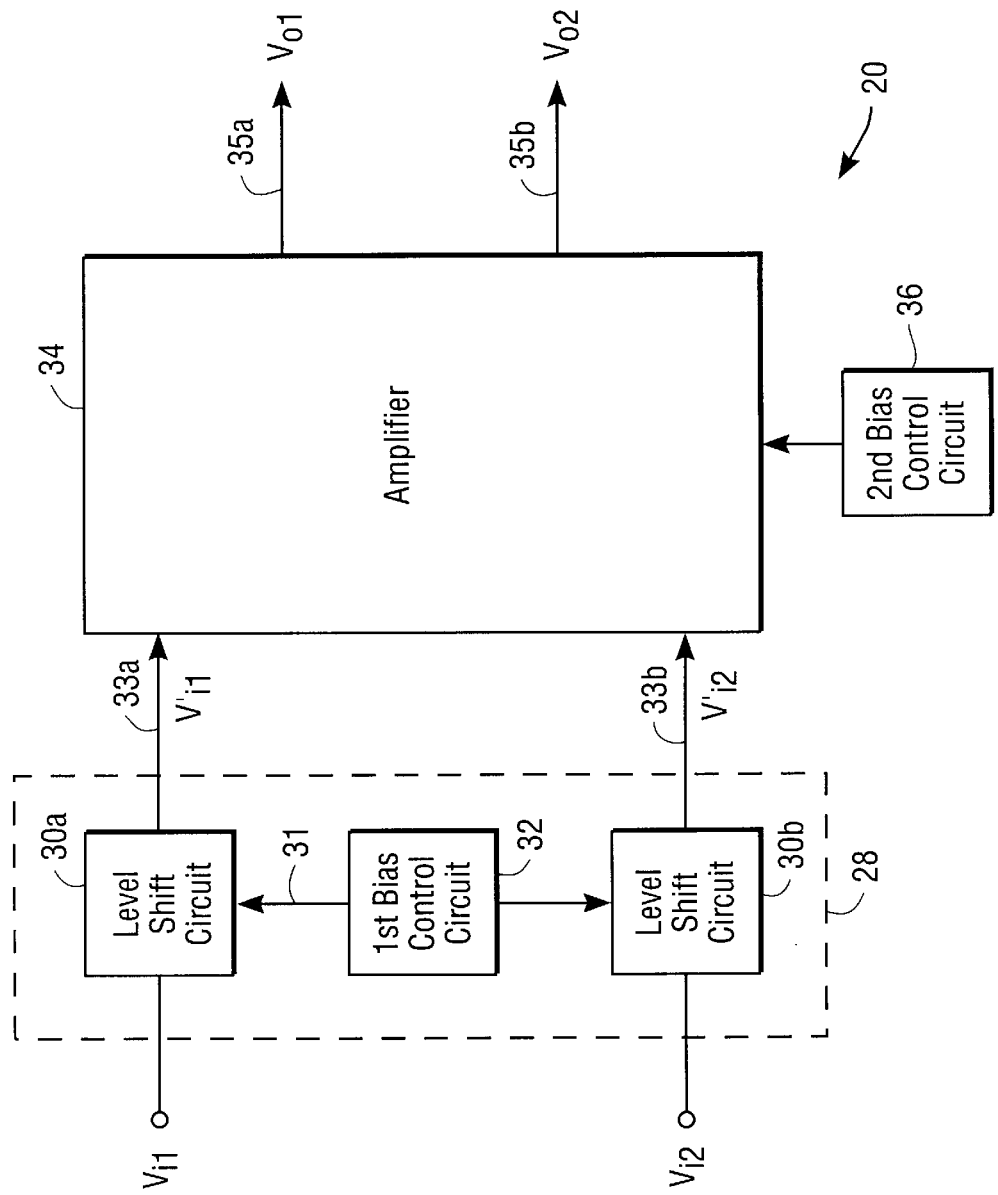
FIG. 2 is a block diagram a single stage amplifier of the present invention.

FIG. 2 illustrates in block diagram form an amplifier stage 20 for stages 2-N of interface chip 16. To facilitate future discussion, amplifier stage 20 is shown as a differential level shift circuit 28 followed by a differential amplifier 34. (Amplifier stage 20 could equally well be described and illustrated as a differential amplifier followed by a differential level shift circuit. The sole difference between these two approaches being whether or not the first amplifier stage includes a differential level shift circuit. When using amplifier stage 20 of FIG. 2, the first amplifier stage need not include a differential level shift circuit on its input port.)

Differential level shift circuit 28 includes two level shift circuits 30a and 30b, which are identical except for the input signal applied to them. Each level shift circuit 30a and 30b steps down the DC level of its input sufficiently to allow headroom for amplifier 34 to operate given the DC power supply or supplies. In one embodiment, the DC power supply is 3 volts and each level shift circuit 30 steps its input down by approximately 0.9 volts DC. The exact amount of step down per level shift circuit 30 is a design choice. The minimum DC level of the signal output by each level shift circuit 30a and 30b is controlled by first bias control circuits 32. First bias control circuit 32 insures that the minimum DC level output by its stage remains constant across variations in temperature and the GaAs process used to fabricate interface chip 16.

Differential amplifier 34 receives level-shifted input signals $v'_{i1}$ 33a and $v'_{i2}$ 33b from differential level shift circuit 28 and amplifies them to generate output signals $v_{o1}$ 35a and $v_{o2}$ 35b, which will become the inputs to the next amplifier stage 20. Second bias control circuit 36 insures that minimum DC voltage level of output signals $v_{o1}$ 35a and $v_{o2}$ 35b remains constant across variations in temperature and the GaAs process used to fabricate interface chip 16.

Figure 3:
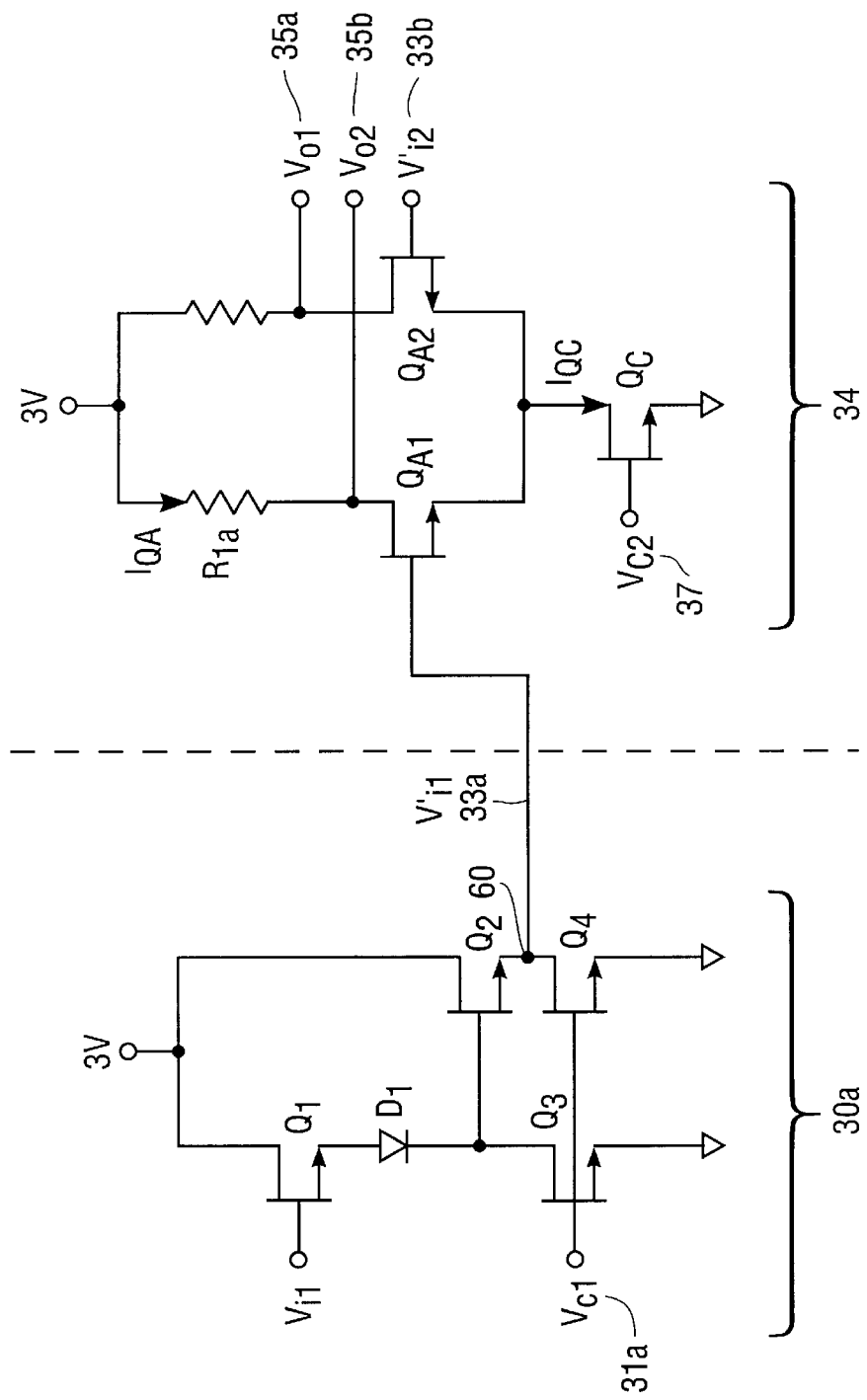
FIG. 3 is a schematic diagram of a level shift circuit and an amplifier.

FIG. 3 illustrates schematically a single level shift circuit 30a and differential amplifier 34. Level shift circuit 30a performs two functions in amplifier stage 20. First, it steps down the DC level of input voltage $v_{i1}$ by approximately 0.9 volts. Circuit 30a uses transistor $Q_1$, diode $D_1$ and transistor $Q_2$ to step $v_{i1}$ down to $v'_{i1}$ 33a. In GaAs, the gate-to-source voltage, $V_{GS}$, of transistors $Q_1$ and $Q_2$ is approximately 300 mV, as is the diode drop, $V_D$, of $D_1$. The precise amount of step down from level shift circuit 30 is not as important to the present invention as the amount of step down remaining constant across process and temperature induced variations in operational characteristics. The second function of level shift circuit 30a is to insure a minimum level bias level of $v'_{i1}$ 33a. Transistor $Q_4$ performs this function with its drain tied to output node 60 of level shift circuit 30a. Transistor $Q_2$ cannot pull output node 60 below the level at the drain of transistor $Q_4$.

B. The Differential Amplifier and Its Bias Requirements

Still referring to FIG. 3, differential amplifier 34 exhibits the classic circuit configuration, with amplifying transistors $Q_{A1}$ and $Q_{A2}$ matched and opposed to one another. Transistor $Q_C$ functions as a current source for the two amplifying transistors, $Q_{A1}$ and $Q_{A2}$. The maximum bias current through each leg of differential amplifier 34 is controlled by the bias voltage, $V_{C2}$ 37, applied to the gate of $Q_C$. (For a more detailed discussion of Differential Amplifiers and their operation see Horowitz and Hill: The Art of Electronics, pp.80–83 (1980).)

Proper biasing to insure linear operation of differential amplifier 34 requires the drain-to-source voltage, $V_{DS}$, of transistor $Q_C$, be greater than 400–500 mV under all conditions. Performance of differential amplifier 34 degrades when $V_{DS}$ drops below this level. Any difficulty in insuring that $V_{DS}$ is at least 400–500 mV for $Q_C$ will arise when $v'_{i1}$ 33a and $v'_{i2}$ 33b are balanced; i.e., equal to one another. Balance brings the source of $Q_C$ to its lowest level, which must be at least 400 mV under all circumstances. This bias requirement will be referred to as the first bias requirement.

Similarly, proper biasing of differential amplifier 34 requires that the drain-to-source voltages, $V_{DS}$, of amplifying transistors $Q_{A1}$ and $Q_{A2}$ be greater than 400–500 mV under all conditions. Any difficulty in insuring that $V_{DS}$ is at least 400–500 mV for $Q_{A1}$ will arise when the voltage at its gate, $v'_{i1}$ 33a, is pulled high. In this case, the current pulled by $Q_{A1}$, $I_{QA}$ is at its greatest, equal to $I_{QC}$. This maximum current brings the voltage at the drain of $Q_{A1}$ to its lowest level. At the same time, because its gate is at its highest level, the source of $Q_{A1}$ will also be at its highest level. The difference between the maximum source voltage and minimum drain voltage of $Q_{A1}$ must nonetheless be at least 400–500 mV. Analogously, any difficulty in insuring that $V_{DS}$ is at least 400–500 mV for $Q_{A2}$ will arise when the voltage at its gate, $v'_{i2}$ 33b, is pulled high. Therefore, analogously, the difference between the maximum source voltage and minimum drain voltage of $Q_{A2}$ must nonetheless be at least 400–500 mV. This bias requirement of the amplifying transistors will be referred to as the second bias requirement.

B1. Meeting the Amplifier's First and Second Bias Requirements

How can the amplifier's first bias requirement be met? Consider the first bias requirement in conjunction with the amplifier illustrated in FIG. 2. The drain of $Q_C$ is coupled to the source of $Q_{A1}$, whose voltage level be approximately 300 mV less than the voltage at the gate of $Q_{A1}$, which is coupled to $v'_{i1}$ 33a.

Given:

$$V_D \text{ min of } Q_C = 400 \text{ mV};$$

and $$V_D \text{ of } Q_C = V_S \text{ of } Q_{A1};$$

Then:

$$V_S \text{ min of } Q_{A1} = 400 \text{ mV}. \quad (1)$$

As a result of the GaAs process and the fact that no other force is driving the source of $Q_{A1}$, the source voltage of $Q_{A1}$ should be approximately 300 mV less than the gate voltage for $Q_{A1}$. In other words:

$$V_G \text{ min of } Q_{A1} = V_S \text{ min of } Q_{A1} + 300 \text{ mV}. \quad (2)$$

Using equation (1) to substitute for $V_S$ min in equation (2), yields equation (3).

$$V_G \text{ min of } Q_{A1} = 700 \text{ mV} \quad (3)$$

Thus, the amplifier's first bias requirement can be satisfied by insuring that $V_G$ min of $Q_{A1}$=700 mV, regardless of temperature and process variations. Analogously, the minimum gate voltage for $Q_{A2}$ is 700 mV.

FIG. 3 reveals that any specification of the minimum voltage level at the gates of $Q_{A1}$ and $Q_{A2}$ is also a specification of the minimum voltage levels of $v'_{i1}$ and $v'_{i2}$. As discussed previously with respect to level shift circuit 30, the minimum level $v'_{i1}$ is controlled by $V_{C1}$ 31. Thus, proper biasing of differential amplifier 34 requires controlling $V_{C1}$ 31 across temperature and process such that equation (3) is satisfied. For future reference refer to this as the first bias control requirement.

Turning now to the amplifier's second bias requirement, how can it be satisfied? Recall that the second bias requirement is that $V_{DS}$ min of $Q_{A1}$=400 mV when $I_{QA}$=$I_{QC}$. Reference to FIG. 3 reveals that $V_{DS}$ is equal to the value of the positive power supply, $V_{pp}$, minus the voltage drop across resistor $R_{A1}$, or:

$$V_D \text{ min of } Q_{A1} = V_{pp} - I_{QA} R_{A1}. \quad (4)$$

Substituting for $I_{QA}$ under the bias condition of concern ($I_{QA}$=$I_{QC}$), yields equation (5).

$$V_D \text{ min of } Q_{A1} = V_{pp} - I_{QC} R_{A1}. \quad (5)$$

Thus, the minimum drain voltage of $Q_{A1}$ can be controlled by controlling the bias current of $Q_C$. In turn, $I_{QC}$ max can easily be controlled by controlling the voltage at the gate of $Q_C$, $V_{C1}$ 37, over temperature and process. As before, the situation is entirely analogous for $Q_{A2}$. Thus, proper biasing of the amplifying transistors requires controlling $V_{C2}$ 37 such that equation (5) is satisfied. This constitutes the second bias control requirement.

C. Bias Control Circuits

Figure 4:
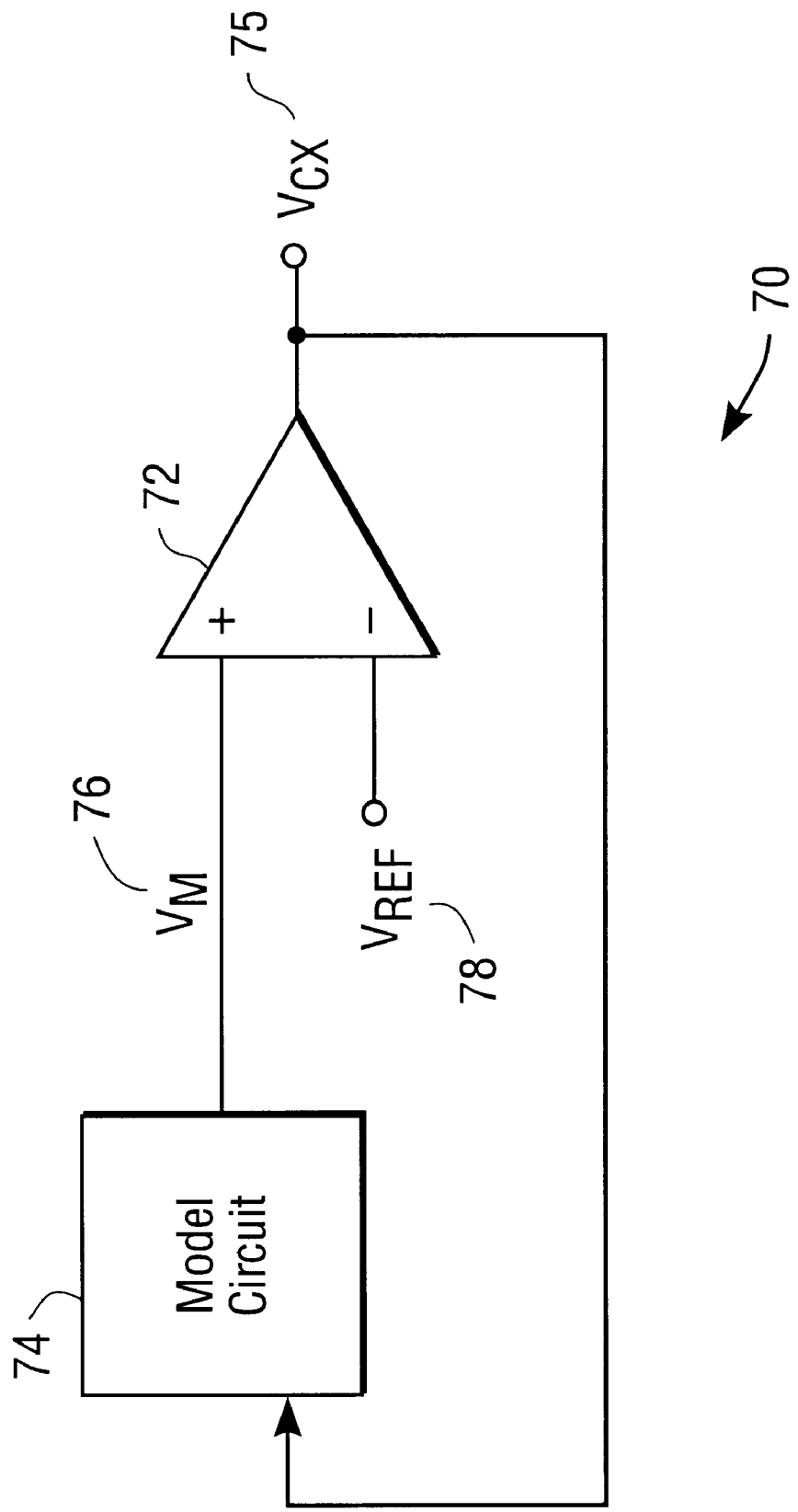
FIG. 4 is a block diagram a generic bias control circuit according to the present invention.

The first bias control circuit 32 satisfies the first bias control requirement while the second bias control circuit 36 satisfies the second bias control requirement. In addition to sharing similar functions, circuits 32 and 36 share a similar circuit configuration. FIG. 4 illustrates in block diagram form generic bias control circuit 70, which generally describes both circuits 32 and 36. Generic bias control circuit 70 includes model circuit 74 and operational amplifier 72.

Model circuit 74 models the behavior of the circuit to be controlled as temperature and process varies for the given bias control requirement. Model circuit 74 receives at its input the same bias control voltage, $V_{cx}$ 75, that will be input to the circuit to be controlled. In other words, first bias control voltage, $V_{C1}$ 31, is input to both model circuit 74 of first bias control circuit 32 and to level shift circuit 30. Similarly, second bias control voltage, $V_{C2}$ 37, is input to both model circuit 74 of second bias control circuit 36 and differential amplifier 34. In response to bias control voltage $V_{cx}$ 75, model circuit 74 produces an output voltage $V_M$ 76 that models how the bias voltage to be controlled should vary with temperature and process. For example, the voltage being controlled via $V_{C1}$ 31 is $v'_i$ 33. Thus, model circuit 74 of first bias control circuit 32 models how temperature and process changes within level shift circuit 30 cause $v'_i$ 33 to change. In the case of second bias control circuit 36, $V_{C2}$ 37 controls $v_o$ 35, which is output by amplifier 34. Thus, model circuit 74 of second bias control circuit 36 models how temperature and process changes within amplifier 34 cause $v_o$ 35 to vary.

The output of model circuit 74, $V_M$ 76, is applied to one input of operational amplifier 72. The second operational amplifier input is coupled to a DC reference voltage, $V_{REF}$ 78, representative of desired voltage level for the relevant bias control voltage. As a result, operational amplifier 72 varies the level of $V_{cx}$ 75 as necessary to force $V_M$ 76 to equal $V_{REF}$ 78. This means that operational amplifier 72 varies its output voltage, $V_{cx}$ 75, as necessary to satisfy the relevant bias control requirement despite variations caused by temperature and process in the operation of the circuit being controlled. Preferably, operational amplifier 72 is realized using a design discussed in detail below with respect to FIGS. 7 and 8.

C1. The First Bias Control Circuit

Figure 5:
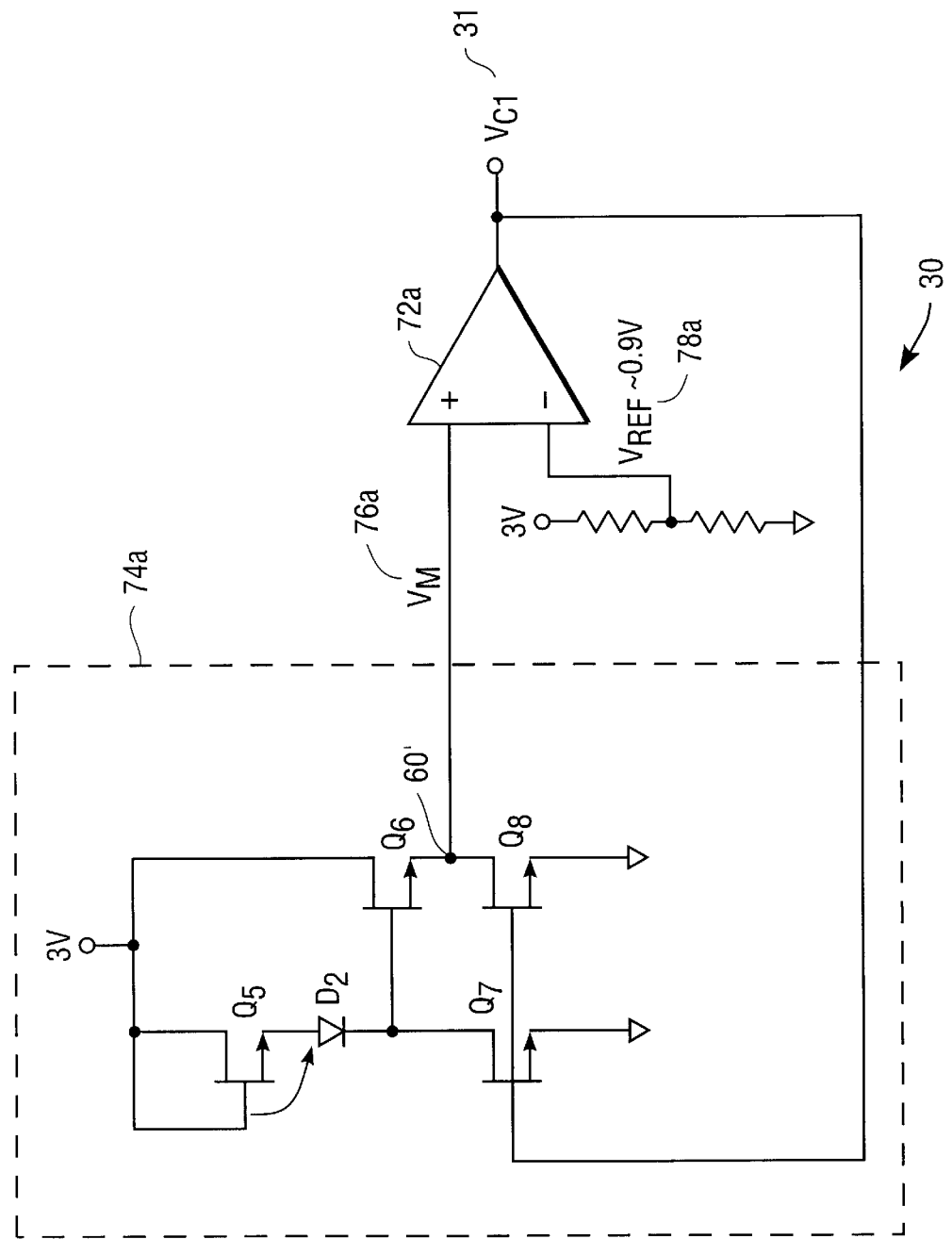
FIG. 5 is a schematic diagram a first bias control circuit.

FIG. 5 illustrates schematically first bias control circuit 30, which includes level shift model circuit 74a and operational amplifier 72a. Because it models level shift circuit 30, model circuit 74a is substantially equivalent to level shift circuit 30. To insure that model circuit 74a responds the same way to temperature and process that level shift circuit 30 does, each device in model circuit 74a is identical to the corresponding device in the associated level shift circuit 30. In other words, in so far as possible given the fabrication tools and process being used, $Q_5$ is identical to $Q_1$, $D_2$ to $D_1$, $Q_6$ to $Q_2$, $Q_7$ to $Q_3$, and $Q_8$ to $Q_4$. Additionally, to further minimize any variations in the performance characteristics of a first bias control circuit 32 as compared to its associated level shift circuit 30, each first bias control circuit 32 should be located as close as possible on chip 16 to its associated level shift circuit 30.

The primary difference between model circuit 74a and level shift circuit 30 is not in their device configuration, but in the voltage applied to the gate of $Q_5$ as compared to that applied to gate of $Q_1$. While a signal, $v_{i1}$, is applied to $Q_1$, the gate of $Q_5$ is tied to a DC voltage, $V_{pp}$.

Model circuit 74 couples to operational amplifier 72a the voltage at node 60' as $V_M$ 76a. This is because node 60' represents node 60 of level shift circuit 30, which outputs $v'_{i1}$ 33, whose voltage level is controlled via $V_{C1}$. The second operational amplifier input is coupled to $V_{REF}$ 78a. The value of $V_{REF}$ 78a is determined by the first bias control requirement; i.e., $V_{REF}$=0.7 V. Operational amplifier 72a varies $V_{C1}$ 31 as necessary to insure that $V_M$ 76a remains constant at 0.7 V regardless of how temperature and process variations alter the performance characteristics of $Q_5$, $D_2$, $Q_6$, $Q_7$ and $Q_8$. In other words, $V_{C1}$ 31 will vary as necessary to satisfy the first bias control requirement.

C2. The Second Bias Control Circuit

Figure 6:
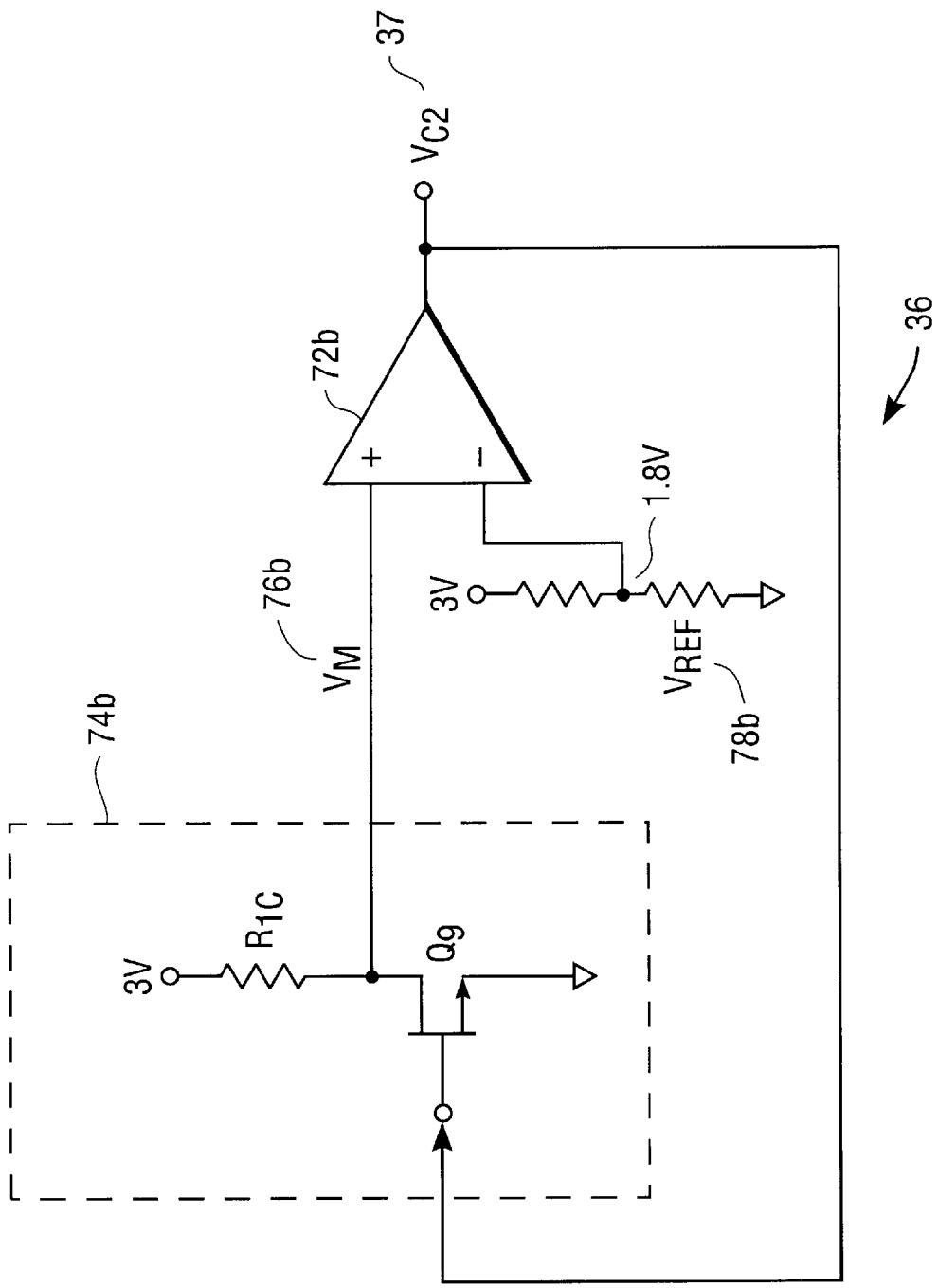
FIG. 6 is a schematic diagram a second bias control circuit.

FIG. 6 illustrates schematically second bias control circuit 36, which includes amplifier model circuit 74b and operational amplifier 72b. While amplifier model circuit 74b could be realized using a circuit identical to amplifier 34, such a complex model circuit is unnecessary. This is because the second bias control requirement, which circuit 36 is to satisfy, arises from all of the current from $Q_C$ flowing through a single amplifier leg; i.e, $I_{QAX}=I_{QC}$. Thus, only one leg of the amplifier has an effect upon the voltage to be controlled, $v_o$ 35, allowing amplifier 34 to be modeled by a single leg. Amplifier model circuit 74b can be simplified still further by omitting the amplifying transistor of the relevant amplifier leg because the voltage to be controlled, $v_o$, at its minimum is equal to $V_{pp}-I_{QC}R_{1A}$. Consequently, amplifier model circuit 74b accurately models amplifier 34 under the relevant bias control condition using a single transistor, $Q_9$ and resistor, $R_{1C}$. To insure that $V_M$ 76b varies with temperature and process in the same manner that $v_o$ 35 does, $Q_9$ is identical to $Q_A$ and $R_{1C}$ is identical to $R_{1A}$ in so far as possible given the fabrication tools and process being used. Additionally, to further minimize any variations in the performance characteristics of a second bias control circuit 36 as compared to its associated differential amplifier 34, each second bias control circuit 36 should be located as close as possible on chip 16 to its associated differential amplifier 34.

The voltage at the drain of $Q_9$ is coupled to operational amplifier 72b as $V_M$ 76b as the voltage at this point represents $v_o$ min. The value of $V_{REF}$ 78b, which is coupled to the second operational amplifier input, is determined by the second bias control requirement. In one embodiment of the present invention $V_{REF}$ is set to the desired maximum output voltage, approximately 1.8 V. Operational amplifier 72b varies its output voltage $V_{C2}$ 37 as necessary to insure that $V_M$ 76b remains constant at $V_{REF}$ 78b regardless of how temperature and process variations alter the performance characteristics of $Q_9$. Consequently, $V_{C2}$ 37 will vary as necessary to maintain $v_o$ min =$V_{REF}$, even while one leg of amplifier 34 draws all the tail current, $I_{QC}$, and regardless of how temperature and process variations alter the performance characteristics of $Q_C$. In other words, $V_{C2}$ 37 will vary as necessary to satisfy the second bias control requirement.

D. A Temperature Compensated GaAs Operational Amplifier

Figure 7:
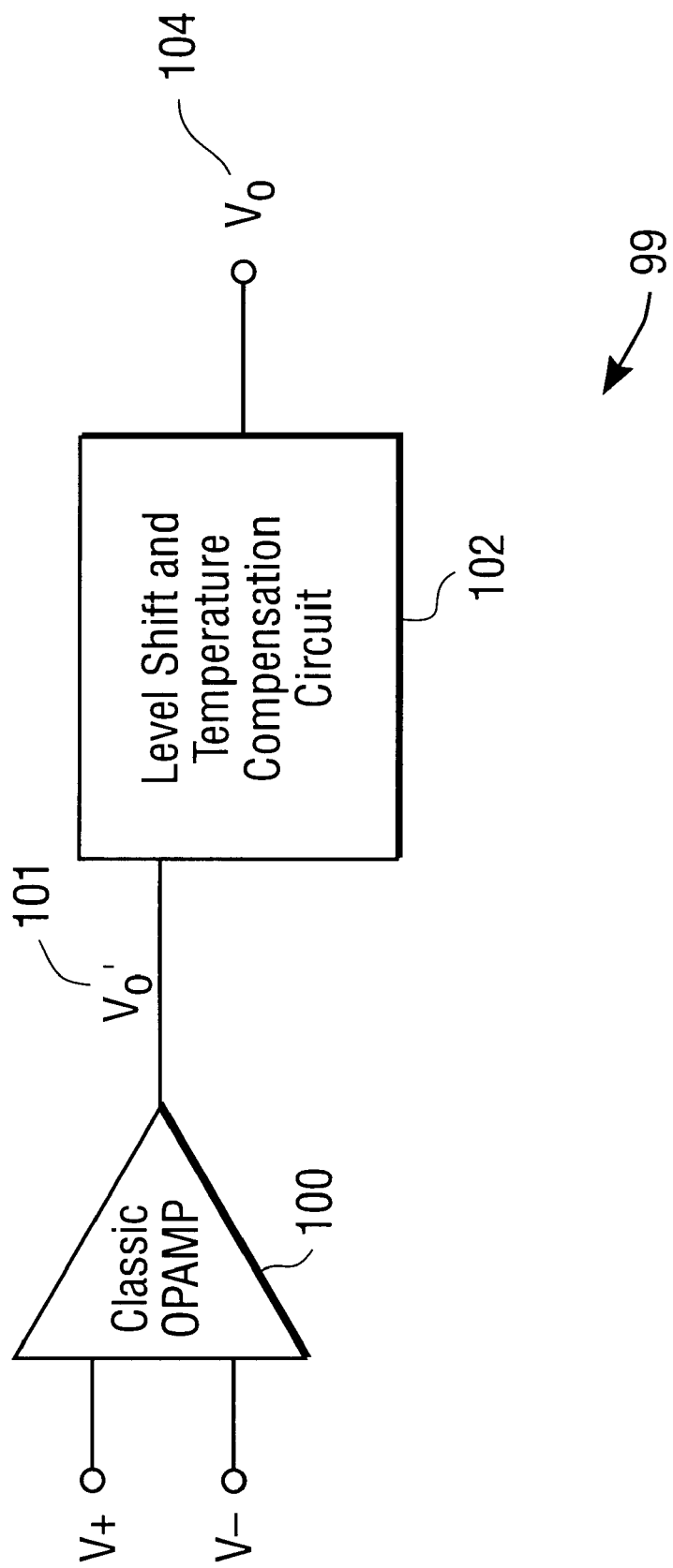
FIG. 7 is a block diagram of a temperature compensated operational amplifier of the present invention.

Realizing a satisfactory operational amplifier 72 by fabricating a classic operational amplifier circuit in GaAs is difficult because p-channel devices are not available in GaAs. Using just n-channel devices restricts the operational amplifier output voltage to be near the power supply voltage. This restricted high output voltage does not allow the operational amplifier output to swing much before entering saturation or clipping. FIG. 7 illustrates in block diagram form an improved operational amplifier 99 that overcomes these difficulties and can be satisfactorily used to realize operational amplifier 72 of the bias control circuits 30 and 36. In addition to a classic operational amplifier circuit 100, operational amplifier 99 includes a level shift and temperature compensation circuit 102. As implied by its name, circuit 102 steps down the voltage output by circuit 100, $v'_o$ 101, to a more satisfactory level, $v_o$ 104. Additionally, circuit 102 compensates for any temperature and process variations that might cause output voltage 104 to vary.

Figure 8:
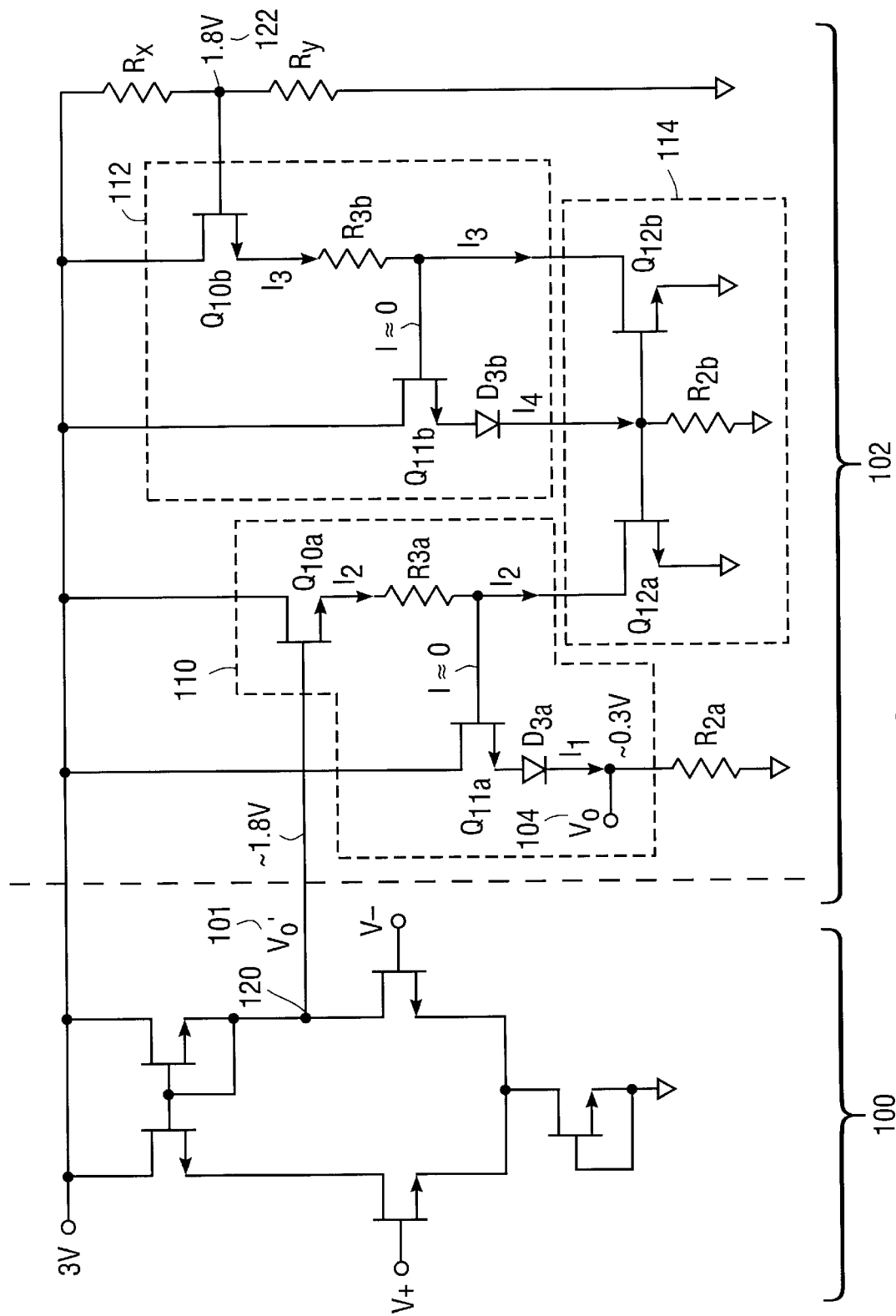
FIG. 8 is a schematic diagram of the temperature compensated operational amplifier of FIG. 7.

FIG. 8 illustrates improved operational amplifier 99 in schematic diagram form. While illustrated, operational amplifier circuit 100 will not be discussed in detail herein.

(For a more detailed discussion of circuit 100, see Horowitz and Hill: The Art of Electronics (1980), pp. 83, 92–116) Level shift and temperature compensation circuit 102 includes a second level shift circuit 110, temperature compensation circuit 112 and current mirror 114.

Second level shift circuit 110 steps down $v_o'$ 101 down from approximately 1.8 volts to approximately 0.3 volts at $v_o$ 104. The exact amount of step down from $v_o'$ 101 to $v_o$ 104 is not as important as ensuring that $v_o$ 104 remain constant regardless of changes in the operation of second level shift circuit 110 caused by temperature and process. Having said that, the step down provided by circuit 110 should provide ample headroom for operational amplifier 99 to operate before going into saturation or clipping. Second level shift circuit 110 includes $Q_{10a}$, $R_{3a}$, $Q_{11a}$, $D_{3a}$ and $R_{2a}$. The relationship between $v_o'$ 101 and $v_o$ 104 can easily be calculated from FIG. 8 with the appropriate substitution for $V_{GS}$ and $V_d$, as:

$$v_o = v_o' - V_{GS10a} - V_d - I_2 R_{3a} - V_{GS11a} - V_{d3a} \tag{6}$$

Equation (6) reveals that $I_2$ can be used to vary output voltage $v_o$. If $I_2$ is chosen properly it can be used to compensate for variations in temperature and process.

How can $I_2$ be varied as necessary to hold $v_o$ 104 constant across temperature and process? Circuit 102 does this using temperature compensation circuit 112 and current mirror 114. Temperature compensation circuit 112 generates the proper compensation current, $I_2$. Current mirror 114 generates $I_2$ using $I_3$.

Temperature compensation circuit 112 is able to perform its function because it is substantially equivalent to level shift circuit 110 and acts like the previously discussed model circuits. The devices within temperature compensation circuit 112 are as identical as possible to those within second level shift 110. In other words, $Q_{10b}$ is identical to $Q_{10a}$, $R_{3b}$ to $R_{3a}$, $Q_{11b}$ to $Q_{11a}$, $D_{3b}$ to $D_{3a}$ and $R_{2b}$ to $R_{2a}$. Additionally, to minimize any difference due to process variation across a die, circuit 112 should be located as close as possible to circuit 110 and the gates of their transistors and should be in the same orientation. $I_3$ varies only in response to temperature and process induced changes in the operation of circuit 112 because the voltage applied to input node 122 of circuit 112 is held constant at the expected level of $v_o'$ 101.

Current mirror 114 uses the classic configuration, so its operation need not be discussed in detail herein. The two transistors of current mirror 114, $Q_{12a}$ and $Q_{12b}$, are matched to ensure equality of the currents flowing through the opposite sides of the current mirror.

E. Conclusion

In the foregoing specification, the invention has been described with reference to specific exemplary embodiments thereof. It will, however, be evident that various modifications and changes may be made thereto without departing from the broader spirit and scope of the invention as set forth in the appended claims. Accordingly, the specification and drawings are to be regarded in an illustrative rather than a restrictive sense.

What is claimed is:

1. A precision GaAs amplifier, comprising:
  a) a first level shift circuit for level shifting an input signal to generate a level shifted input signal, the level shifted input signal having a first bias level controlled by a first bias control voltage;
  b) an amplifier for amplifying the level shifted input signal to generate an output signal, the output signal having a second bias level controlled by a second bias control voltage;
  c) a first bias control circuit for generating the first bias control voltage such that the first bias control voltage varies as necessary, with respect to a process that fabricated the GaAs amplifier, to hold constant the first bias level; and
  d) a second bias control voltage for generating the second bias control voltage.

2. The precision GaAs amplifier of claim 1 wherein the first bias control circuit comprises:
  c1) a first operational amplifier outputting the first bias control voltage at a first operational amplifier output, the first operational amplifier having a first input coupled to a first DC reference voltage, the first operational amplifier having a second input; and
  c2) a first model circuit for generating the first bias level in response to the first bias control voltage, the first bias level being coupled to the second input of the first operational amplifier, the first model circuit modeling at least a portion of the first level shift circuit.

3. The precision GaAs amplifier of claim 2 wherein the first model circuit comprises:
  c2A) a first transistor having a source;
  c2B) a diode having an anode and a cathode, the anode being coupled to the source of the first transistor;
  c2C) a second transistor having a source and a gate, the gate of the second transistor being coupled to the cathode of the diode, the source of the second transistor being coupled to a node generating the first bias level;
  c2D) a third transistor having a drain and a gate, the gate of the third transistor being coupled to the first bias control voltage, the drain of the third transistor being coupled to the cathode of the diode; and
  c2E) an fourth transistor having a drain and a gate, the drain of the fourth transistor being coupled to the node, the gate of the fourth transistor being coupled to the first bias control voltage.

4. The precision GaAs amplifier of claim 2 wherein the first operational amplifier comprises:
  c1A) an operational amplifier circuit generating a first voltage level at a node;
  c1B) a second level shift circuit coupled to the node for shifting the first voltage level down to a second voltage at the first operational amplifier output, a first current flowing through the second level shift circuit and effecting a level of the second voltage, the first current changing in response to temperature changes;
  c1C) a temperature compensation circuit coupled to the second level shift circuit for maintaining the first voltage level at a second DC voltage level, the temperature compensation circuit being equivalent to the second level shift circuit, a second current in the temperature compensation circuit changing in response to temperature changes; and
  c1D) a current mirror coupled between the second level shift circuit and the temperature compensation circuit, the current mirror reflecting changes in the second current such that the first current equals the second current.

5. The precision GaAs amplifier of claim 4 wherein the second level shift circuit comprises:
  i) a first transistor having a gate and a source, the gate of the first transistor being coupled to the node;
  ii) a second transistor having a gate and a source, the gate of the second transistor being coupled to the source of the first transistor; and iii) a diode coupled between the source of the second transistor and the first operational amplifier output.

6. The precision GaAs amplifier of claim 4 wherein the temperature compensation circuit comprises:
   i) a first a gate and a source, the gate of the first transistor being coupled to a third DC reference voltage;
   ii) a second transistor having a gate and a source, the gate of the second transistor being coupled to the source of the first transistor; and
   iii) a diode coupled between the source of the second transistor and the current mirror.

7. The precision GaAs amplifier of claim 1 wherein the first level shift circuit comprises:
   a1) a first transistor having a gate and a source, the gate of the first transistor being coupled to the input signal;
   a2) a diode having an anode and a cathode, the anode being coupled to the source of the first transistor;
   a3) a second transistor having a gate and a source, the gate of the second transistor being coupled to the cathode of the diode, the source of the second transistor being coupled to a node generating the level shifted input signal;
   a4) a third transistor having a gate and a drain, the gate of the third transistor being coupled to the bias control voltage, the drain of the third transistor being coupled to the cathode of the diode; and
   a5) a fourth transistor having a gate and a drain, the gate of the fourth transistor being coupled to the first bias control voltage, the drain of the fourth transistor being coupled to the node.

8. The precision GaAs amplifier of claim 1 wherein the amplifier comprises:
   b1) a first amplifying transistor having a drain, a source and a gate, the gate being coupled to the level shifted input signal, the drain outputting the output signal; and
   b2) a first current source transistor coupled to the source of the first amplifying transistor, the first current source transistor having a gate coupled to the second bias control voltage; and
   b3) a first resistor having a first terminal and a second terminal, the first terminal of the first resistor being coupled to the drain of the amplifying transistors the second terminal of the first resistor being coupled to a positive DC power supply, the first resistor having a first value of resistance.

9. The precision GaAs amplifier of claim 2 wherein the second bias control circuit comprises:
   d1) a second operational amplifier for outputting the second bias control voltage at a second operational amplifier output, the second operational amplifier having a first input coupled to a second DC reference voltage representative of a desired level of the second bias control voltage, the first operational amplifier having a second input; and
   d2) a second model circuit for generating the second bias level in response to the second bias control voltage, the second bias level being coupled to the second input of the second operational amplifier, the second model circuit modeling at least a portion of the amplifier.

10. The precision GaAs amplifier of claim 9 wherein the second model circuit comprises:
    d2A) a first transistor having a drain and a gate, the gate of the first transistor being coupled to the second bias control voltage, the drain being coupled to a node generating the second bias level; and
    d2B) a second resistor having a first terminal and a second terminal, the first terminal of the second resistor being coupled to the positive DC power supply, the second resistor having the first value of resistance.

11. A precision low-voltage GaAs amplifier comprising:
    a multiplicity of DC coupled amplifier stages, each amplifier stage including:
    1) a first level shift circuit for level shifting an input signal to generate a level shifted input signal, the level shifted input signal having a first bias level controlled by a first bias control voltage, the first bias control voltage varying as necessary with temperature and with respect to a process that fabricated the GaAs amplifier to hold constant the first bias level; and
    2) an amplifier for amplifying the level shifted input signal to generate an output signal, the output signal having a second bias level controlled by a second bias control voltage, the second bias control voltage varying as necessary with temperature to hold constant the second bias level.

12. The precision low-voltage GaAs amplifier of claim 11 wherein each amplifier stage further comprises:
    3) a first bias control circuit for generating the first bias control voltage, including:
       A) a first operational amplifier outputting the first bias control voltage at a first operational amplifier output, the first operational amplifier having a first input coupled to a first DC reference voltage, the first operational amplifier having a second input; and
       B) a first model circuit for generating the first bias level in response to the first bias control voltage, the first bias level being coupled to the second input of the first operational amplifier, the first model circuit modeling at least a portion of the first level shift circuit.

13. The precision low-voltage GaAs amplifier of claim 12 wherein the first operational amplifier comprises:
    i) an operational amplifier circuit generating a first voltage level at a node;
    ii) a second level shift circuit coupled to the node for shifting the first voltage level down to a second voltage at the first operational amplifier output, a first current flowing through the second level shift circuit and effecting a level of the second voltage, the first current changing in response to temperature changes;
    iii) a temperature compensation circuit coupled to the second level shift circuit for maintaining the first voltage level at a second DC voltage level, the temperature compensation circuit being substantially identical to the second level shift circuit, a second current in the temperature compensation circuit changing in response to temperature changes; and
    iv) a current mirror coupled between the second level shift circuit and the temperature compensation circuit, the current mirror reflecting changes in the second current such that the first current equals the second current.

14. The precision low-voltage GaAs amplifier of claim 11 wherein each amplifier stage further comprises:
    4) a bias control circuit for generating the second bias control voltage, including:
       A) an operational amplifier for outputting the second bias control voltage at an operational amplifier output, the operational amplifier having a first input coupled to a DC reference voltage, the operational amplifier having a second input; and B) a model circuit for generating the second bias level in response to the second bias control voltage, the second bias level being coupled to the second input of the operational amplifier, the model circuit modeling at least a portion of the amplifier.

15. A precision GaAs amplifier, comprising:

a) a first level shift circuit for level shifting an input signal to generate a level shifted input signal, the level shifted input signal having a first bias level controlled by a first bias control voltage;

b) an amplifier for amplifying the level shifted input signal to generate an output signal, the output signal having a second bias level controlled by a second bias control voltage;

c) a first bias control circuit for generating the first bias control voltage, wherein the first bias control circuit comprises:

c1) a first operational amplifier outputting the first bias control voltage at a first operational amplifier output, the first operational amplifier having a first input coupled to a first DC reference voltage, the first operational amplifier having a second input; and c2) a first model circuit for generating the first bias level in response to the first bias control voltage, the first bias level being coupled to the second input of the first operational amplifier, the first model circuit modeling at least a portion of the first level shift circuit; and d) a second bias control voltage for generating the second bias control voltage.

16. The precision GaAs a amplifier of claim 15 wherein the first model circuit comprises:

c2A) a first transistor having a source;

c2B) a diode having an anode and a cathode, the anode being coupled to the source of the first transistor;

c2C) a second transistor having a source and a gate, the gate of the second transistor being coupled to the cathode of the diode, the source of the sixth transistor being coupled to a node generating the first bias level;

c2D) a third transistor having a drain and a gate, the gate of the third transistor being coupled to the first bias control voltage, the drain of the third transistor being coupled to the cathode of the diode; and c2E) an fourth transistor having a drain and a gate, the drain of the fourth transistor being coupled to the node, the gate of the fourth transistor being coupled to the first bias control voltage.

17. The precision GaAs amplifier of claim 15 wherein the first operational amplifier comprises:

c1A) an operational amplifier circuit generating a first voltage level at a node;

c1B) a second level shift circuit coupled to the node for shifting the first voltage level down to a second voltage at the first operational amplifier output, a first current flowing through the second level shift circuit and effecting a level of the second voltage, the first current changing in response to temperature changes;

c1C) a temperature compensation circuit coupled to the second level shift circuit for maintaining the first voltage level at a second DC voltage level, the temperature compensation circuit being equivalent to the second level shift circuit, a second current in the temperature compensation circuit changing in response to temperature changes; and c1D) a current mirror coupled between the second level shift circuit and the temperature compensation circuit, the current mirror reflecting changes in the second current such that the first current equals the second current.

18. The precision GaAs amplifier of claim 17 wherein the second level shift circuit comprises:

i) a first transistor having a gate and a source, the gate of the first transistor being coupled to the node;

ii) a second transistor having a gate and a source, the gate of the second transistor being coupled to the source of the first transistor; and iii) a diode coupled between the source of the second transistor and the first operational amplifier output.

19. The precision GaAs amplifier of claim 17 wherein the temperature compensation circuit comprises:

i) a first transistor having a gate and a source, the gate of the first transistor being coupled to a third DC reference voltage;

ii) a second transistor having a gate and a source, the gate of the second transistor being coupled to the source of the first transistor; and iii) a diode coupled between the source of the second transistor and the current mirror.

20. The precision GaAs amplifier of claim 15 wherein the first level shift circuit comprises:

a1) a first transistor having a gate and a source, the gate of the first transistor being coupled to the input signal;

a2) a diode having an anode and a cathode, the anode being coupled to the source of the first transistor;

a3) a second transistor having a gate and a source, the gate of the second transistor being coupled to the cathode of the diode, the source of the second transistor being coupled to a node generating the level shifted input signal;

a4) a third transistor having a gate and a drain, the gate of the third transistor being coupled to the first bias control voltage, the drain of the third transistor being coupled to the cathode of the diode; and a5) a fourth transistor having a gate and a drain, the gate of the fourth transistor being coupled to the first bias control voltage, the drain of the fourth transistor being coupled to the node.

* * * * *